(12) United States Patent
Wojcik et al.

(10) Patent No.: US 10,785,841 B2
(45) Date of Patent: Sep. 22, 2020

(54) DRIVER CIRCUIT FOR LIGHT-EMITTING COMPONENT

(71) Applicant: OSRAM OLED GmbH, Regensburg (DE)

(72) Inventors: Andreas Wojcik, Regensburg (DE); Hubert Halbritter, Dietfurt-Toeging (DE); Josip Maric, Sinzing (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/328,794

(22) PCT Filed: Aug. 30, 2017

(86) PCT No.: PCT/EP2017/071715
§ 371 (c)(1),
(2) Date: Feb. 27, 2019

(87) PCT Pub. No.: WO2018/041868
PCT Pub. Date: Mar. 8, 2018

(65) Prior Publication Data
US 2019/0215921 A1  Jul. 11, 2019

(30) Foreign Application Priority Data

Sep. 1, 2016  (DE) .......................... 10 2016 116 368

(51) Int. Cl.
*H05B 45/37* (2020.01)
*H05B 45/46* (2020.01)
(Continued)

(52) U.S. Cl.
CPC ........... *H05B 45/37* (2020.01); *H01S 5/0428* (2013.01); *H01S 5/4025* (2013.01); *H05B 45/44* (2020.01); *H05B 45/46* (2020.01); *H01S 5/4031* (2013.01)

(58) Field of Classification Search
CPC .......... H01S 5/042; H01S 5/40; H01S 5/0428; H01S 5/4031; H05B 33/0824; H05B 33/08
(Continued)

(56) References Cited

U.S. PATENT DOCUMENTS

| | | | |
|---|---|---|---|
| 3,806,829 A * | 4/1974 | Duston | H01S 3/092 372/38.01 |
| 2013/0002165 A1* | 1/2013 | Rouvala | H05B 45/37 315/294 |

(Continued)

FOREIGN PATENT DOCUMENTS

| | | |
|---|---|---|
| DE | 24 37 839 | 3/1975 |
| DE | 100 41 079 | 3/2002 |

(Continued)

*Primary Examiner* — Tuan N Nguyen
(74) *Attorney, Agent, or Firm* — DLA Piper LLP (US)

(57) ABSTRACT

A driver circuit for at least one light-emitting optoelectronic component includes a control circuit having a capacitor and a control switch, wherein the control switch electrically connects to the component such that the component is supplied with current by the capacitor as a function of a switching state of the control switch, and a charging circuit having at least a first charging switch, a bias resistor and a buffer capacitor, wherein the charging circuit electrically connects to the capacitor and is configured to charge the capacitor through the bias resistor, and the buffer capacitor is linked to a connecting line between the bias resistor and the capacitor.

20 Claims, 2 Drawing Sheets

(51) Int. Cl.
   *H01S 5/40*   (2006.01)
   *H05B 45/44*  (2020.01)
   *H01S 5/042*  (2006.01)
(58) Field of Classification Search
   USPC .......................................... 372/29.01, 29.015
   See application file for complete search history.

(56) References Cited

U.S. PATENT DOCUMENTS

| | | | | |
|---|---|---|---|---|
| 2013/0069547 | A1* | 3/2013 | van de Ven | H05B 45/44 315/188 |
| 2014/0070712 | A1* | 3/2014 | Lee | H05B 45/37 315/186 |

FOREIGN PATENT DOCUMENTS

| | | |
|---|---|---|
| DE | 20 2009 008 337 U1 | 10/2009 |
| DE | 10 2013 216 552 | 2/2015 |
| GB | 1 478 668 | 7/1977 |
| WO | 2016/113301 | 7/1916 |
| WO | 2014/199382 | 12/2014 |

\* cited by examiner

DRIVER CIRCUIT FOR LIGHT-EMITTING COMPONENT

TECHNICAL FIELD

This disclosure relates to a driver circuit for at least one light-emitting optoelectronic component and a method of controlling the driver circuit.

BACKGROUND

It is known to provide a pulse laser component having four laser diodes and an integrated driver, the charging current intended to be limited by an internal short circuit. To this end, a bias resistor that limits the maximum current through the driver circuit in the event of a short circuit is provided in the driver circuit. The effect of the bias resistor is, however, that a maximum pulse repetition rate is limited.

It could therefore be helpful to provide an improved driver circuit and an improved method of controlling the driver circuit.

SUMMARY

We provide a driver circuit for at least one light-emitting optoelectronic component including a control circuit having a capacitor and a control switch, wherein the control switch electrically connects to the component such that the component is supplied with current by the capacitor as a function of a switching state of the control switch, and a charging circuit having at least a first charging switch, a bias resistor and a buffer capacitor, wherein the charging circuit electrically connects to the capacitor and is configured to charge the capacitor through the bias resistor, and the buffer capacitor is linked to a connecting line between the bias resistor and the capacitor.

We also provide a method of controlling a driver circuit for at least one light-emitting optoelectronic component, wherein a first capacitor of the first component is charged with the aid of a parallel circuit of a buffer capacitor and with the aid of a bias resistor and of a first voltage terminal, the first component is supplied with current by the first capacitor, the first capacitor is discharged after the powering of the first component, in a continuous operation of the first component the first component is supplied with current in an initial phase by the capacitor and by the buffer capacitor, and after the initial phase, the component is supplied with current through the bias resistor by the first voltage terminal.

We further provide a driver circuit for at least one light-emitting optoelectronic component including a control circuit having a capacitor and having a control switch, wherein the control switch electrically connects to the component such that the component is supplied with current by the capacitor as a function of a switching state of the control switch, a charging circuit having at least a first charging switch, a bias resistor and a buffer capacitor, the charging circuit electrically connected to the capacitor and configured to charge the capacitor through the bias resistor, wherein the buffer capacitor is linked to a connecting line between the bias resistor and the capacitor, a plurality of light-emitting components and a capacitor for each component, wherein the control switch connects to the components such that a component is supplied with current by the capacitor as a function of the switching state of the control switch, the charging circuit connects to the capacitors and configured to charge the capacitors through the bias resistor, the buffer capacitor is linked to a connecting line between the bias resistor and the capacitors, the charging circuit has a second charging switch, the second charging switch connects to the at least one capacitor to discharge the at least one capacitor, the charging circuit has for each capacitor a charging branch having a series circuit with a first and a second charging switch, and from each charging branch, starting from a connecting line from the first to the second charging switches, a link line is routed to one respective capacitor.

Figure 1:
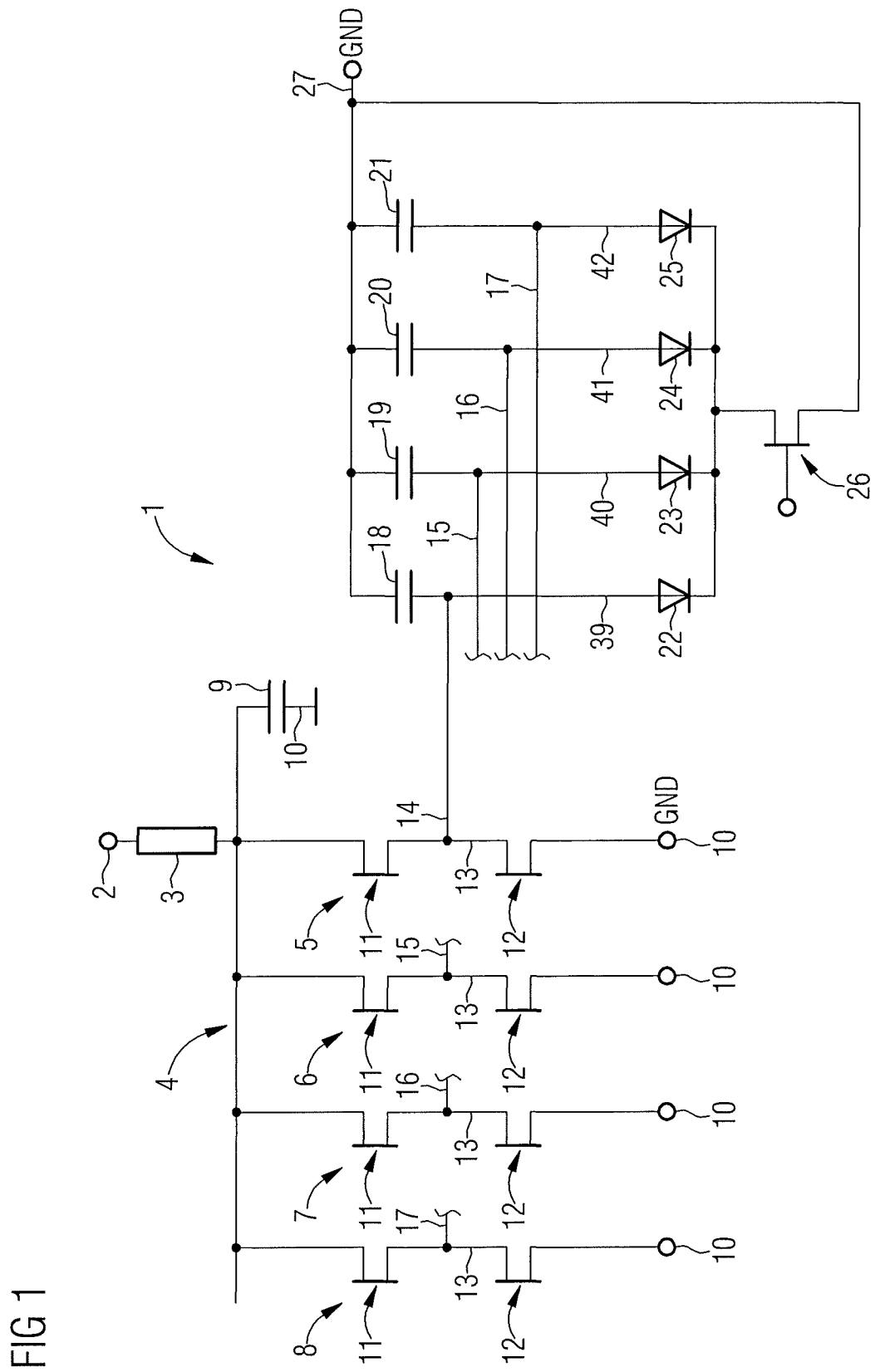
FIG. 1 schematically shows an equivalent electrical circuit diagram of the driver circuit.

LIST OF REFERENCES 1 driver circuit
2 first voltage terminal
3 bias resistor
4 charging circuit
5 first charging branch
6 second charging branch
7 third charging branch
8 fourth charging branch
9 buffer capacitor
10 ground
11 first switch
12 second switch
13 connecting line
14 first link line
15 second link line
16 third link line
17 fourth link line
18 first capacitor
19 second capacitor
20 third capacitor
21 fourth capacitor
22 first component
23 second component
24 third component
25 fourth component
26 control switch
27 second voltage terminal
31 first characteristic curve
32 second characteristic curve
33 third characteristic curve
34 fourth characteristic curve
35 first light pulse signal
36 second light pulse signal
37 third light pulse signal
38 fourth light pulse signal
39 first further connecting line
40 second further connecting line
41 third further connecting line
42 fourth further connecting line

DETAILED DESCRIPTION

One advantage of our driver circuit is that a pulse repetition rate can be selected to be higher than in conventional devices, while a maximum current of the driver circuit is still limited in the event of a short circuit of the driver circuit.

This is achieved with a buffer capacitor provided between the bias resistor and the capacitor of the driver circuit. The effect of the buffer capacitor is that the pulse repetition rate can be selected to be higher. Furthermore, in the event of a short circuit in the driver circuit, the current for the driver circuit is limited by the bias resistor. Sufficient energy is held by the additional buffer capacitor to be able to charge the capacitor of the component rapidly. In a short circuit in the driver circuit, first, the capacitor of the component and the buffer capacitor are discharged, and then further operation of the optoelectronic component is limited by the bias resistor.

The bias resistor may be dimensioned such that the maximum available current lies below a function threshold and, therefore, the light-emitting optoelectronic component cannot be operated in light-emitting operation without charging of the capacitor and the buffer capacitor. With the aid of this arrangement, in continuous powering of the component, it is possible to limit the light emission of the light-emitting optoelectronic component.

A plurality of light-emitting components may be provided, a capacitor being provided for each component. The control switch connects to the component such that a component is supplied with current by the assigned capacitor as a function of the switching state of the control switch. The charging circuit connects to the capacitors and configured to charge the capacitors through the bias resistor. The buffer capacitor is linked to a connecting line between the bias resistor and the capacitor. In this way, a plurality of light-emitting components can be supplied with current, and furthermore the current of the driver circuit can be limited in continuous powering of the components.

The charging circuit may have a second charging switch, the second charging switch being connected to the at least one capacitor to discharge the capacitor. In this way, it is possible not only to charge but also discharge the capacitor.

The charging circuit may have for each capacitor a charging branch having a series circuit with a first and a second charging switch. The two switches connect to one another by a connecting line. Starting from the connecting line, a link line is routed to one respective capacitor. In this way, a simple structure of the charging circuit for a plurality of capacitors is provided.

The connecting line of the charging branch may be linked to a further connecting line that connects the capacitor to the component.

The control switch may be arranged in series between the component and a voltage terminal. The capacitor may be arranged in series between the component and a second voltage terminal. The first and the second voltage terminals may connect to one another and, in particular, connect to ground.

The buffer capacitor may have at least two times the capacitance of the capacitor, in particular from one to ten times or the capacitance of the capacitor, or an even greater capacitance.

The driver circuit may be configured to be able to carry out charging and/or discharging of a capacitor in less than two microseconds, particularly in less than one microsecond.

The driver circuit may be configured to operate a component with a pulse width for the light output of less than 15 ns, in particular less than 10 ns.

The light-emitting optoelectronic component may be configured as a light-emitting diode or as a laser diode. In particular, a plurality of light-emitting optoelectronic components may be integrated in a semiconductor component. For example, a plurality of laser diodes may be integrated in a laser bar. A compact structure is thereby achieved.

With the aid of the method, rapid and efficient charging of the capacitor, and operation of the optoelectronic light-emitting component are achieved.

The above-described properties, features and advantages, as well as the way in which they are achieved, will become more clearly and readily compensable in conjunction with the following description of examples that will be explained in more detail in connection with the drawings.

FIG. 1 shows a schematic representation of a driver circuit 1 having a first voltage terminal 2, the voltage terminal 2 being linked by a bias resistor 3 to a charging circuit 4. The charging circuit 4 comprises at least one charging branch 5, 6, 7, 8. A buffer capacitor 9 having a first terminal is linked between the bias resistor 3 and the charging circuit 4. A second terminal of the buffer capacitor 9 connects to a second voltage potential 10, for example, to ground. A charging branch 5, 6, 7, 8 has a first and a second switch 11, 12.

The first switch 11 connects by a first terminal to the bias resistor 3 and a second terminal to a connecting line 13. The connecting line 13 is routed to a first terminal of the second switch 12. A second terminal of the second switch 12 connects to a further voltage potential, for example, to ground 10. In a similar way, the second, third and fourth charging branches 6, 7, 8 also have two switches 11, 12 connected in series that connects to one another by a connecting line 13. The first and the second switch 11, 12 constitute a first and a second charging switch.

The connecting line 13 connects by a first link line 14 to a first terminal of a first capacitor 18. The first terminal of the first capacitor 18 is linked by a first further connecting line 39 to a first terminal of a light-emitting optoelectronic first component 22. A second terminal of the first component 22 connects by a control switch 26 to a second voltage terminal 27. Furthermore, the second terminal of the first capacitor 18 likewise connects to the second voltage terminal 27. The second voltage terminal 27 may, for example, connect to ground potential. A light-emitting optoelectronic component means optoelectronic components that emit any type of electromagnetic radiation. The radiation may lie around ultraviolet range, in the visible range or in the infrared range.

In the example, in parallel with the first capacitor 18 and the first component 22, a second capacitor 19 and a second light-emitting optoelectronic component 23, a third capacitor 20 and a third light-emitting optoelectronic component 24 and a fourth capacitor 21 and a fourth light-emitting optoelectronic component 25 are connected in parallel. In this example, the second terminals of the second, third and fourth components 23, 24, 25 each connect by the control switch 26 to the second voltage terminal 27. Fewer or more capacitors and components may also be connected in series. A charging branch is provided for each series circuit of a capacitor and a component.

The second capacitor 19 connects by the second terminal, which is connected by a second further connecting line 40 to the second component 23, by a second link line 15 to the connecting line 13 of the second charging branch 6.

The third capacitor 20 connects by the second terminal, which is connected by a third further connecting line 41 to the third component 24, by a third link line 16 to the connecting line 13 of the third charging branch 7.

The fourth capacitor 21 connects by the second terminal, which is connected by a fourth further connecting line 42 to the fourth component 25, by a fourth link line 17 to the connecting line 13 of the fourth charging branch 8.

If only one capacitor 18 and one light-emitting optoelectronic component 22 are provided, one charging branch 5 is also sufficient. The charging switches 11, 12 of the charging circuit 4 and the control switch 26 are driven by control logic (not shown).

The bias resistor 3 is dimensioned such that, in the event of a short circuit in the charging circuit and/or in the event of a short circuit of the control switch 26, the current for at least one light-emitting optoelectronic component 22 to 25 is limited to a predetermined value. To this end, the value of the bias resistor 3 may be selected such that the at least one component can no longer generate light at least after an initial phase, in which the component is supplied with current by the associated capacitor and the buffer capacitor 9. After the initial phase, the current is delivered to the component through the bias resistor. The buffer capacitor 9 has a capacitance that allows rapid charging of the capacitors 18, 19, 20, 21 in spite of the bias resistor 3. The capacitors can therefore be charged rapidly and the components can be operated with a high pulse repetition rate. Furthermore, it is possible to prevent the components from being operated in continuous-wave mode in the event of a short circuit, for example, of the control switch 26. A desired eye safety is therefore achieved.

The charging switches 11, 12 and the control switch 26 may, for example, be configured as field-effect transistors, in particular as MOSFETs. The buffer capacitor 9 has a capacitance at least two times as great as the capacitance of one of the capacitors 18 to 21, in particular up to ten times the capacitance of one of the capacitors 18 to 21. Furthermore, the capacitance of the buffer capacitor 9 may also be more than ten times the capacitance of one of the capacitors 18 to 21. The capacitors 18 to 21 may have the same capacitance or different capacitances. The components 22 to 25 may be configured identically or differently. For example, the components 22 to 25 may be configured as light-emitting diodes or as laser diodes. The components 22 to 25 may furthermore be integrated in a semiconductor component, particularly in a light-emitting diode bar or a laser bar.

Figure 2:
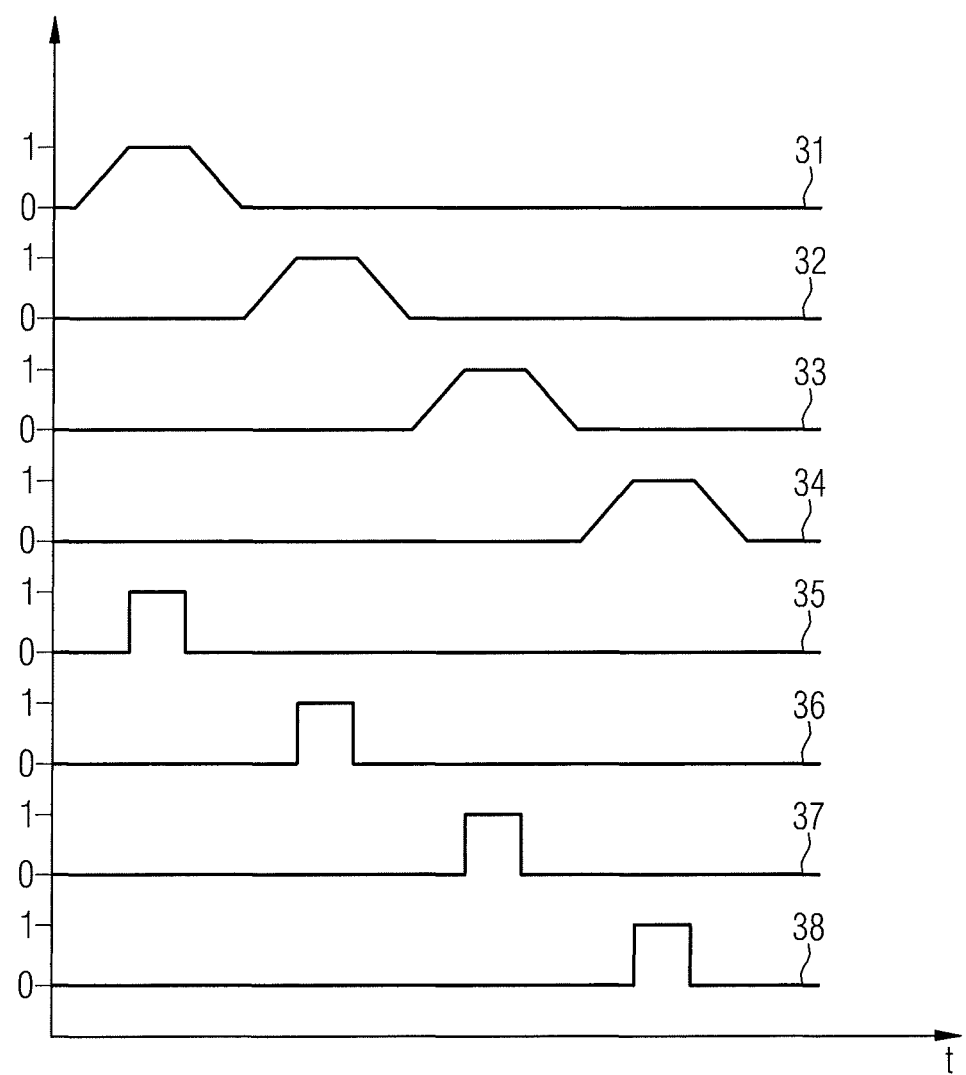
FIG. 2 schematically shows a temporal voltage profile of the capacitors and of the light pulses of the optoelectronic light-emitting components of FIG. 1.

FIG. 2 shows a schematic representation of a temporal profile of charging voltages 31, 32, 33, 34 of the capacitors 18, 19, 20, 21 and a temporal profile of the light pulses 35, 36, 37, 38 of the components 22 to 25 of FIG. 1. The capacitors 18, 19, 20, 21 may, for example, have a capacitance of 47 nF. The buffer capacitor 9 may, for example, have a capacitance of 470 nF. The first characteristic curve 31 shows the temporal profile of the charging voltage at the first capacitor 18. The second characteristic curve 32 shows the temporal profile of the charging voltage at the second capacitor 19. The third characteristic curve 33 shows the temporal profile of the charging voltage at the third capacitor 20. The fourth characteristic curve 34 shows the temporal profile of the voltage at the fourth capacitor 21. The light pulses of the light-emitting optoelectronic components 22 to 25 are represented chronologically synchronously with the voltage profiles of the capacitors. The first light pulse signal 35 shows the temporal profile of the light pulse of the first component 22. The second light pulse signal 36 shows the temporal profile of the light pulse of the second component 23. The third light pulse signal 37 shows the temporal profile of the light pulse of the third component 24. The fourth light pulse signal 38 shows the temporal profile of the light pulse of the fourth component 25. As can be seen with the aid of the diagrams of FIG. 2, the capacitors are chronologically in succession charged and discharged again before the following capacitor is charged and discharged again. The components are driven such that the light pulse is started after a maximum voltage at the capacitor is reached, and the capacitor is discharged again after the end of the light pulse. The pulse width for a light signal is, for example, 5 ns. The voltage of the capacitors varies between a value of 0 and a value of 1. The light signal of the components varies between a value of 0 and a value of 1. The representation of the voltage profiles and the representation of the light pulse signals are depicted in a simplified and schematic way.

By the use of the buffer capacitor 9 having a capacitance that allows charging of at least two capacitors, rapid charging of the capacitors can be achieved. At the same time, the maximum current flowing through the components is limited by the bias resistor 3. For example, the pulse sequences of a component may have a time spacing of 1 ms. Within this time, the buffer capacitor can be completely recharged again. A time constant for the charging and/or discharging of a capacitor 18, 19, 20, 21 may be less than 1 μs.

For example, the value of the bias resistor may be 4Ω. In a voltage of 24 V at the first voltage terminal 2, a maximum current of 3 A may, for example, flow through a light-emitting optoelectronic component.

The second charging switch 12 and the link to ground 10 may be omitted in a charging branch. In this example, discharging of a capacitor would not be possible. Furthermore, instead of one charging branch for each light-emitting optoelectronic component, it is possible to provide only one charging branch for a plurality of light-emitting optoelectronic components. In this example, a corresponding switch is provided that can alternately connect the one charging branch to the individual components, or to the capacitors of the components.

For example, discharging of the buffer capacitor may take place within 200 ns. The capacitors are fully charged again between two pulse sequences of the component that, for example, are 1 ms.

Our circuits and methods have been illustrated and described in detail with the aid of preferred examples. This disclosure is not, however, restricted to the examples. Rather, other variants may be derived therefrom by those skilled in the art without departing from the protective scope of the appended claims.

This application claims priority of DE 10 2016 116 368.6, the subject matter of which is incorporated herein by reference.

What is claimed is:

1. A driver circuit for a light-emitting optoelectronic component comprising:
   a control circuit having a series connection of a capacitor, the light-emitting optoelectronic component and a control switch, wherein the control switch is arranged in series between the light-emitting optoelectronic component and a voltage terminal, and the capacitor is arranged in series between the light-emitting optoelectronic component and the voltage terminal, and the capacitor is connected by a further connecting line with the light-emitting optoelectronic component, and
   the light-emitting optoelectronic component is supplied with current by the capacitor as a function of a switching state of the control switch;
   a charging circuit having a first voltage terminal, wherein the first voltage terminal is linked by a bias resistor to a first terminal of a charging branch, a first terminal of a buffer capacitor is linked with the first terminal of the charging branch, a second terminal of the buffer capacitor is a further voltage terminal, the charging branch comprises a first charging switch and a second charging switch, the first charging switch is connected by a connecting line with the second charging switch, the connecting line of the charging branch is connected with the further connecting line between the capacitor and the light-emitting optoelectronic component, a second terminal of the charging branch is an additional voltage terminal, and the charging circuit is configured to charge the capacitor through the bias resistor and the buffer capacitor.

2. The driver circuit as claimed in claim 1, wherein the control circuit has a second series connection of a second capacitor and a second light-emitting optoelectronic component, the second capacitor is connected by a second further connecting line with the second light-emitting optoelectronic component, the second series connection is connected with the voltage terminal and the control switch and is arranged parallel to the series connection of the capacitor and the light-emitting optoelectronic component, and the control switch supplies the second component with current by the second capacitor as a function of the switching state of the control switch, the charging circuit connects to the second further connecting line between the second capacitor and the second component and is configured to charge the second capacitor through the bias resistor.

3. The driver circuit as claimed in claim 2, wherein the charging circuit has a second charging branch,
a first terminal of the second charging branch is linked with the first terminal of the charging branch, the second charging branch comprises a first charging switch and a second charging switch, the first charging switch is connected by a second connecting line with the second charging switch, the second connecting line of the second charging branch is connected with the second further connecting line between the second capacitor and the second light-emitting optoelectronic component, and a second terminal of the second charging branch is an additional voltage terminal.

4. The driver circuit as claimed in claim 1, wherein the buffer capacitor has at least two times the capacitance of the capacitor.

5. The driver circuit as claimed in claim 1, wherein the buffer capacitor has from one to ten times or more the capacitance of the capacitor.

6. The driver circuit as claimed in claim 1, wherein the driver circuit is configured such that charging and/or discharging of the capacitor takes less than 2 µs or less than 1 µs.

7. The driver circuit as claimed in claim 1, wherein the driver circuit is configured such that a pulse width of the light-emitting optoelectronic component is less than 15 ns or less than 10 ns.

8. The driver circuit as claimed in claim 1, wherein the light-emitting optoelectronic component is configured as a light-emitting diode or as a laser diode.

9. The driver circuit as claimed in claim 1, wherein the bias resistor is dimensioned such that a maximum available current lies below a function threshold of the light-emitting optoelectronic component, and the light-emitting optoelectronic component cannot be operated in light-emitting operation without charging of the capacitor and of the buffer capacitor.

10. The driver circuit as claimed in claim 1, wherein the buffer capacitor has a capacitance that allows rapid charging of the capacitor in spite of the bias resistor, the capacitor can be charged rapidly and the light-emitting optoelectronic component can be operated with a high pulse repetition rate, and the light-emitting optoelectronic component is prevented from being operated in continuous-wave mode in the event of a short circuit of the control switch.

11. A method of controlling a driver circuit for a light-emitting optoelectronic component comprising:
a control circuit having a series connection of a capacitor, the light-emitting optoelectronic component and a control switch, wherein the control switch is arranged in series between the light-emitting optoelectronic component and a voltage terminal, and the capacitor is arranged in series between the light-emitting optoelectronic component and the voltage terminal, wherein the capacitor is connected by a further connecting line with the light-emitting optoelectronic component,
wherein the light-emitting optoelectronic component is supplied with current by the capacitor as a function of a switching state of the control switch;
a charging circuit having a first voltage terminal, wherein the first voltage terminal is linked by a bias resistor to a first terminal of a charging branch, a first terminal of a buffer capacitor is linked with the first terminal of the charging branch, a second terminal of the buffer capacitor is a further voltage terminal, the charging branch comprises a first charging switch and a second charging switch, the first charging switch is connected by a connecting line with the second charging switch, and the connecting line of the charging branch is connected with the further connecting line between the capacitor and the light-emitting optoelectronic component, wherein a second terminal of the charging branch is an additional voltage terminal as claimed in claim 1, wherein the capacitor is charged with the aid of the charging branch by a parallel circuit of the buffer capacitor and the bias resistor,
the light-emitting optoelectronic component is supplied with current by the capacitor as a function of a switching state of the control switch,
the capacitor is discharged after the powering of the light-emitting optoelectronic component,
in a continuous operation of, the light-emitting optoelectronic component is supplied with current in an initial phase by the capacitor and by the buffer capacitor, and
after the initial phase, the light-emitting optoelectronic component is supplied with current through the bias resistor by the voltage terminal.

12. The method as claimed in claim 11, wherein the bias resistor has a size such that the light-emitting optoelectronic component cannot be operated in light-emitting operation after the initial phase.

13. The method as claimed in claim 11, wherein the bias resistor is dimensioned such that a maximum available current lies below a function threshold of the light-emitting optoelectronic component, and the light-emitting optoelectronic component cannot be operated in light-emitting operation without charging of the capacitor and of the buffer capacitor.

14. The method of claim 11, wherein the buffer capacitor has a capacitance that allows rapid charging of the capacitor in spite of the bias resistor, the capacitor can be charged rapidly and the light-emitting optoelectronic component can be operated with a high pulse repetition rate, and the light-emitting optoelectronic component is prevented from being operated in continuous-wave mode in the event of a short circuit of the control switch.

15. A driver circuit for a light-emitting optoelectronic component comprising:
a control circuit having a series connection of a capacitor, the light-emitting optoelectronic component and a control switch, wherein the capacitor is connected with a first terminal with a voltage terminal and with a second terminal by a further connecting line with a first terminal of the light-emitting optoelectronic component, a second terminal of the light-emitting optoelectronic component is connected with a first terminal of the control switch, a second terminal of the control switch is connected with the voltage terminal, the voltage terminal is ground potential, and the light-emitting optoelectronic component is supplied with current by the capacitor as a function of a switching state of the control switch;

a charging circuit having a first voltage terminal for positive potential, wherein the first voltage terminal is linked by a bias resistor to a first terminal of a first charging branch, a first terminal of a buffer capacitor is linked with the first terminal of the first charging branch, a second terminal of the buffer capacitor is linked with a further voltage terminal for ground potential, the first charging branch comprises a first charging switch and a second charging switch, the first charging switch is connected by a connecting line with the second charging switch, the connecting line of the first charging branch is connected with the further connecting line between the capacitor and the light-emitting optoelectronic component, a second terminal of the charging branch is linked to an additional voltage terminal for ground potential, and the charging circuit is configured to charge the capacitor through the bias resistor and the buffer capacitor.

16. The driver circuit as claimed in claim 15, wherein the buffer capacitor has at least two times the capacitance of the capacitor.

17. The driver circuit as claimed in claim 15, wherein the driver circuit is configured such that charging and/or discharging of a capacitor takes less than 2 μs or less than 1 μs.

18. The driver circuit as claimed in claim 15, wherein the driver circuit is configured such that a pulse width of the light-emitting optoelectronic component is less than 15 ns or less than 10 ns.

19. The driver circuit as claimed in claim 15, wherein the light-emitting optoelectronic component is configured as light-emitting diodes or as laser diodes.

20. The driver circuit as claimed in claim 15, wherein the bias resistor is dimensioned such that a maximum available current lies below a function threshold of the light-emitting optoelectronic component, and the light-emitting optoelectronic component cannot be operated in light-emitting operation without charging of the capacitor and of the buffer capacitor.

* * * * *